United States Patent
Buynoski

(10) Patent No.: US 6,245,658 B1
(45) Date of Patent: Jun. 12, 2001

(54) METHOD OF FORMING LOW DIELECTRIC SEMICONDUCTOR DEVICE WITH RIGID, METAL SILICIDE LINED INTERCONNECTION SYSTEM

(75) Inventor: Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/252,183

(22) Filed: Feb. 18, 1999

(51) Int. Cl.[7] ............ H01L 21/76; H01L 21/4763; H01L 21/44
(52) U.S. Cl. .......... 438/619; 438/411; 438/421; 438/422; 438/597; 438/621; 438/622; 438/623; 438/655; 438/664; 438/682
(58) Field of Search ................. 438/619, 620, 438/621–623, 630, 421, 586, 411, 592, 422, 597, 637, 649, 655, 660, 663, 664, 678, 682, 778; 257/754, 757, 766

(56) References Cited

U.S. PATENT DOCUMENTS

| 4,898,841 | * | 2/1990 | Ho | 438/652 |
| 4,954,214 | | 9/1990 | Ho | 156/628 |
| 5,117,276 | * | 5/1992 | Thomas et al. | 438/619 |
| 5,413,962 | | 5/1995 | Lur et al. | 438/619 |
| 5,483,104 | | 1/1996 | Godinho et al. | 257/758 |
| 5,708,303 | | 1/1998 | Jeng | 257/758 |
| 5,882,963 | | 3/1999 | Kerber et al. | 438/195 |
| 5,900,668 | | 5/1999 | Wollesen | 257/522 |
| 5,936,295 | | 8/1999 | Havemann et al. | 257/522 |
| 5,950,102 | | 9/1999 | Lee | 438/619 |
| 5,953,626 | | 9/1999 | Hause et al. | 438/622 |
| 6,037,248 | | 3/2000 | Ahn | 438/619 |

FOREIGN PATENT DOCUMENTS 2 247 986   3/1992  (GB) .

OTHER PUBLICATIONS

Silicon Processing for the VLSI Era, vol. 1—Process Technology, Lattice Press, pp. 389–391, 1986.*

* cited by examiner

Primary Examiner—John F. Niebling
Assistant Examiner—Ha Tran Nguyen

(57) ABSTRACT

Multi-level semiconductor devices are formed with reduced parasitic capacitance without sacrificing structural integrity or electromigration performance by removing the inter-layer dielectrics and supporting the interconnection system with a metal silicide lining. Embodiments include depositing a dielectric sealing layer, e.g., silicon nitride, before forming the first metallization level, removing the inter-layer dielectrics after forming the last metallization level, electroplating or electroless plating a metal, such as cobalt or nickel, to line the interconnection system, depositing a thin layer of polycrystalline silicon on the metal, heating to form the metal silicide lining on the interconnection system, and forming dielectric protective layers, e.g. a silane derived oxide bottommost protective layer, on the uppermost metallization level.

17 Claims, 4 Drawing Sheets

METHOD OF FORMING LOW DIELECTRIC SEMICONDUCTOR DEVICE WITH RIGID, METAL SILICIDE LINED INTERCONNECTION SYSTEM

RELATED APPLICATIONS

This application contains subject matter similar to subject matter disclosed in U.S. patent applications Ser. No. 09/225,541 filed on Jan. 5, 1999, now U.S. Pat. No. 6,078,088 issued Jun. 20, 2000, Ser. No. 09/252,186 filed on Feb. 18, 1999, Ser. No. 09/252,184 filed on Feb. 18, 1999, and Ser. No. 09/252,185 filed on Feb. 18, 1999.

TECHNICAL FIELD

The present invention relates to a semiconductor device with reduced capacitance loading, and to a method of manufacturing the semiconductor device. The invention has particular applicability in manufacturing high density, multi-level semiconductor devices comprising submicron dimensions.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect ratios due to miniaturization.

Conventional semiconductor devices typically comprise a semiconductor substrate, typically undoped monocrystalline silicon, and a plurality of sequentially formed inter-layer dielectrics and patterned metal layers. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink into the deep submicron range.

A conductive plug filling a via opening is typically formed by depositing an inter-layer dielectric on a patterned conductive (metal) layer comprising at least one metal feature, forming an opening in the inter-layer dielectric by conventional photolithographic and etching techniques, and filling the opening with a conductive material, such as tungsten (W). Excess conductive material on the surface of the inter-layer dielectric is removed by chemical-mechanical polishing (CMP). One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line.

High performance microprocessor applications require rapid speed of semiconductor circuitry. The speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RC delay caused by the interconnect wiring increases. If the interconnection node is routed over a considerable distance, e.g., hundreds of microns or more, as in submicron technologies, the interconnection capacitance limits the circuit node capacitance loading and, hence, the circuit speed. As design rules are reduced to about 0.18 micron and below, the rejection rate due to integrated circuit speed delays severely limits production throughput and significantly increases manufacturing costs. Moreover, as line widths decrease, electrical conductivity and electromigration resistance become increasingly important.

As device geometries shrink and functional density increases, it becomes increasingly imperative to reduce the capacitance between metal lines. Line-to-line capacitance can build up to a point where delay time and cross talk may hinder device performance. Reducing the capacitance within multi-level metallization systems will reduce the RC constant, cross talk voltage, and power dissipation between the lines.

One way to increase the speed of semiconductor circuitry is to reduce the resistance of a conductive pattern. Conventional metallization patterns are typically formed by depositing a layer of conductive material, notable aluminum or an alloy thereof, and etching, or by damascene techniques wherein trenches are formed in dielectric layers and filled with conductive material. The use of metals having a lower resistivity than aluminum, such as copper, engenders various problems which limit their utility. For example, copper readily diffuses through silicon dioxide, the typical dielectric material employed in the manufacture of semiconductor devices, and adversely affects the devices. In addition, copper does not form a passivation film, as does aluminum. Hence, a separate passivation layer is required to protect copper from corrosion.

The dielectric constant of materials currently employed in the manufacture of semiconductor devices for an inter-layer dielectrics (ILD) spans from about 3.9 for dense silicon dioxide to over 8 for deposited silicon nitride. Prior attempts have been made to reduce the interconnect capacitance and, hence, increase the integrated circuit speed, by developing dielectric materials having a lower dielectric constant than that of silicon dioxide. New materials having low dielectric constants, such as low dielectric constant polymers, teflon and porous polymers have been developed. There has been some use of certain polyimide materials for ILDs which have a dielectric constant slightly below 3.0.

Recent attempts have also resulted in the use of low-density materials, such as an aerogel, which has a lower dielectric constant than dense silicon oxide. The dielectric constant of a porous silicon dioxide, such as an aerogel, can be as low as 1.2, thereby potentially enabling a reduction in the RC delay time. However, conventional practices for producing an aerogel require a supercritical drying step, which increases the cost and degree of complexity for semiconductor manufacturing. Moreover, the use of an aerogel results in a semiconductor device which lacks sufficient structural integrity.

Prior attempts to reduce parasitic RC time delays also include the formation of various types of air gaps or bridges. See, for example, Lur et al., U.S. Pat. No. 5,413,962, Jeng, U.S. Pat. No. 5,708,303 and Saul et al., UK Patent GB2, 247,986A. However, the removal of ILD material becomes problematic in various respects. Firstly, the removal of ILD material adversely impacts the structural integrity of the resulting semiconductor device rendering it unduly fragile. Secondly, the removal of ILD material results in a significant reduction in electromigration resistance of the conductors due to exposed free surfaces.

Accordingly, there exists a need for a method of manufacturing a semiconductor device having reduced parasitic RC time delays with reduced internal capacitance without sacrificing structural integrity and/or electromigration performance.

DISCLOSURE OF THE INVENTION

An advantage of the present invention is a semiconductor device exhibiting reduced parasitic RC time delays without sacrifice of structural integrity and/or electromigration performance.

Another advantage of the present invention is a method of manufacturing a semiconductor device exhibiting reduced parasitic RC time delays without sacrifice of structural integrity and/or electromigration performance.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a substrate with active regions; forming an interconnection system comprising: a first patterned metal layer, over the substrate, having metal features electrically connected to active regions by contacts; a plurality of patterned metal layers over the first patterned metal layer terminating with an uppermost patterned metal layer, each patterned metal layer having metal features electrically connected to metal features of different patterned metal layers by vias; and an inter-layer dielectric between each two consecutive patterned metal layers; removing the inter-layer dielectrics; and forming a metal silicide conductive liner on the metal features and vias.

Embodiments of the present invention comprise forming the conductive liner by initially depositing a metal layer, as by electroplating or electroless plating, such as cobalt(Co) or nickel(Ni), lining the interconnection system, depositing a thin layer of silicon, e.g., polycrystalline silicon, on the metal layer, and heating to effect reaction of the metal and silicon to form the metal silicide conductive liner.

Embodiments of the present invention also include forming a dielectric sealing layer on the semiconductor substrate below the first patterned metal layer, and forming dielectric protective layers on the uppermost metal layer. Embodiments of the present invention further include employing a lead-rich glass, a benzocyclobutene (BCB) resin or a low temperature silica as the ILD material, and employing silicon nitride or a composite of a hydrophobic layer on silicon nitride as the dielectric sealing layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
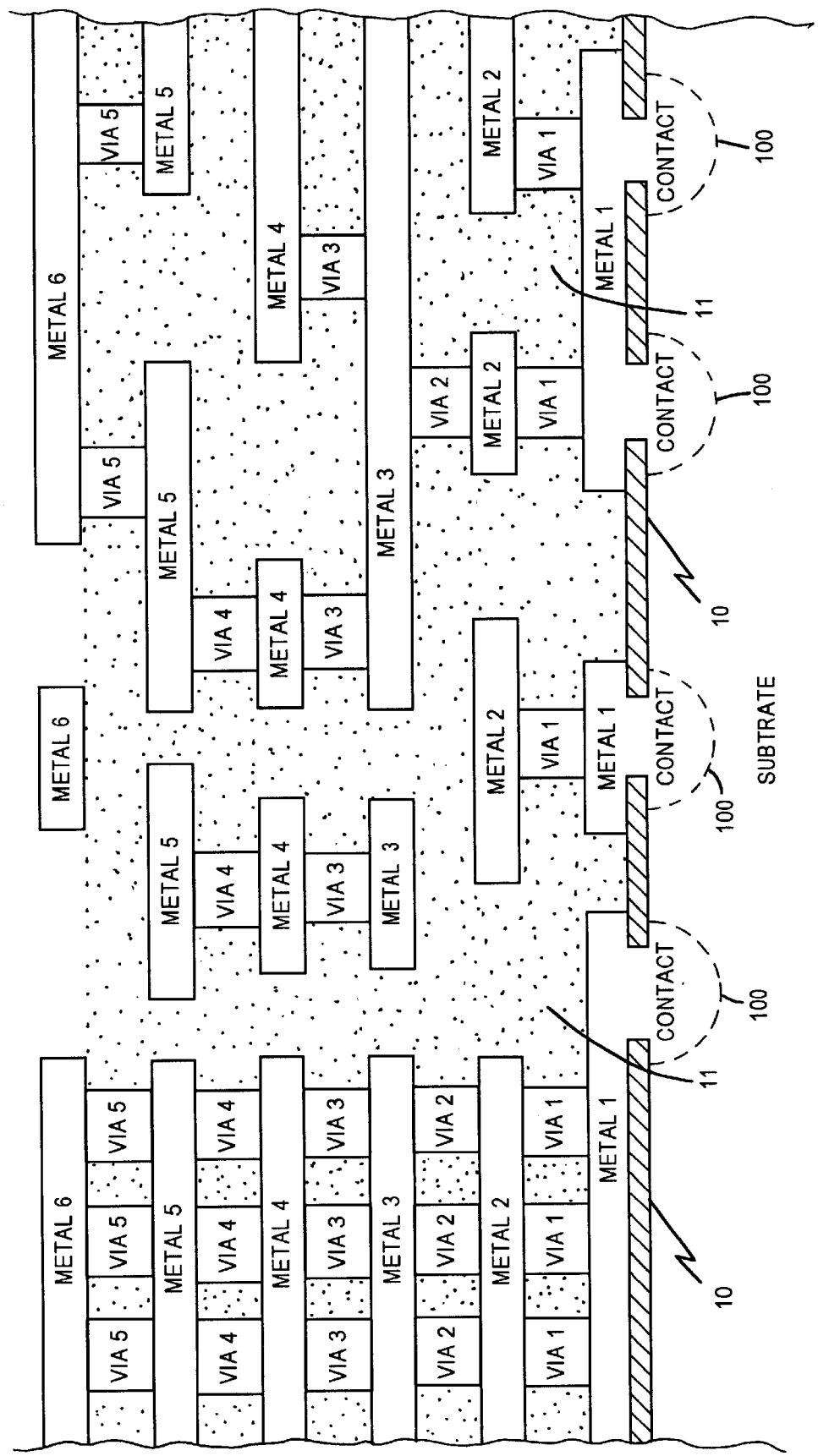
FIGS. 1–4 represent sequential phases of a method in accordance with an embodiment of the present invention, wherein like elements are denoted by like reference numerals.

The present invention addresses and solves problems attendant upon conventional multi-layer interconnection devices, particularly parasitic RC time delays. The capacitance, both layer-to-layer and within-layer, is primarily attributed to the film properties of the ILD. Prior attempts to remove ILDs by creating air tunnels or air gaps create significant structural integrity problems and result in a significant lose of electromigration resistance due to the exposed free surfaces of the conductors. The present invention enables the manufacture of semiconductor devices with a significantly reduced parasitic RC time delay by reducing both the layer-to-layer and within-layer capacitance without adversely impacting structural integrity and without lowering electromigration resistance. Embodiments of the present invention comprise removing the ILDs and providing a metal silicide conductive, stiffening liner on the surfaces of the interconnection system, e.g., metal lines and vias. The resulting stiffened, conductively lined interconnection system comprises air gaps between the patterned metal layers, metal features and vias. The air gaps are, desirably, substantially continuous throughout the interconnection system and substantially reduce the capacitance of the interconnection system. The rigid, metal silicide conductive liner enhances the structural integrity of the resulting semiconductor device and prevents a reduction in electromigration performance by encapsulating the exposed surfaces of the interconnection system.

Embodiments of the present invention comprise initially selectively depositing a metal, such as Co or Ni, lining the surfaces of the metal features and vias, as by electroplating or electroless plating. Embodiments of the present invention include pulse electroplating the metal under conditions such that the overall plating rate is essentially surface-reaction limited. This can be implemented by a series of pulse electroplating stages with intermediate non-plating periods during which the plating species diffuses to the exposed surfaces of the metal features and vias. For example, Co or Ni, is suitably pulse electroplated with non-plating diffusion periods of about 10 to about 60 seconds until a metal lining having a thickness of about 300 Å to about 500 Å is formed enveloping the interconnection system. Electroplating and electroless plating advantageously enables penetration of the plating metal into highly convoluted narrow passages characteristic of multi-level interconnection systems, such that the interconnection system is substantially continuously enveloped.

After depositing the metal layer, a layer of silicon, e.g., polycrystalline silicon, is deposited, as by low pressure chemical vapor deposition, on the metal layer. The silicon layer can suitably be deposited at a thickness of about 150 Å to about 500 Å. Subsequently, heating is conducted, as at a temperature of about 400° C. to about 500° C. for about 30 seconds to about 90 seconds in a non-oxidizing atmosphere to effect reaction of the deposited metal with the deposited silicon to form a metal silicide conductive liner having a thickness of about 500 Å to about 1,000 Å.

Pulse electroplating is generally employed in metal finishing industries and comprises, in its simplest sense, metal deposition by pulse electrolysis, as by interrupted DC current, to electroplate parts. This is effected with a series of pulses of DC current of equal amplitude and duration in the same direction, separated by periods of zero current. The pulse rate (frequency) and ON and OFF intervals x (duty cycle) are controllable to optimize electroplating in a particular situation. Pulse electroplating can be conducted by utilizing a constant current or with constant voltage pulses. In employing pulse electroplating in accordance with the present invention, the relevant variables, such as the duty cycle, frequency and current density in a particular situation, can be optimized in a particular situation given the disclosed objectives.

Embodiments of the present invention comprise depositing a sealing layer either just above the local interconnect or first contact layer in the process sequence, e.g., on the semiconductor substrate below the first metallization layer. The sealing layer is ideally selected such that it is impermeable to the ILD removal technique employed. It is particularly suitable to form a sealing layer which rejects deposition of the subsequently deposited metal layer. Suitable materials for the sealing layer include silicon nitride, since silicon nitride is non-conductive and prevents electrochemical reactions. Additional protection from electroplated metal spreading out from contact areas across the sealing layer surface is achieved by depositing a hydrophobic material on the silicon nitride layer. Suitable hydrophobic materials include fluorpolymers, such as a aryl ethers, e.g., "FLARE" available from Allied Signal Corporations, located in Sunnyvale, Calif.

Virtually any removable dielectric material can be employed in forming the ILDs in accordance with the present invention. It is desirable, however, to select dielectric materials which can be readily removed, e.g., dissolved, without damage to the metal conductors and which, themselves, will not be damaged or destroyed by conventional processing conditions, such as photoresist removal and metal etching. It has been found suitable to employ, as an ILD material, a lead-rich glass capable of being dissolved in acetic acid. Other suitable materials for the ILDs include a benzocyclobutene (BCB)-type resin which is stable with respect to an oxygen-containing plasma conventionally employed to remove photoresist material, but capable of being removed by exposure to a mixed oxygen-fluorine plasma. Another suitable material for the ILDs is a very soft, low density, silica deposited at a relatively low temperature and capable of being removed with a non-acidic or weakly acidic buffered hydrofluoric acid. The latter, relatively porous silica, is compatible with current manufacturing capabilities in that virtually no contamination is introduced.

Embodiments of the present invention also include depositing protective or passivation layers after depositing the metal silicide liner on the conductors of the interconnection system. The protective or passivation layers are deposited above the uppermost patterned metal layer and serve as final protection against environmental contaminants. Penetration of the protective layer into the air gaps can be prevented by overlapping the features of the uppermost patterned metal layer with the features of the immediately underlying patterned metal layer. Another alternative comprises forming narrow gaps between the features of the uppermost patterned metal layer to prevent protective layer penetration. The protective layers include a bottommost protective layer having a thickness of about 5,000 Å to about 15,000 Å, e.g., about 8,000 Å to about 10,000 Å. Suitable materials for use as the bottommost dielectric protective layer include atmospheric pressure silane-base oxide depositions. A silicon nitride or silicon oxynitride layer is then deposited on the bottommost protective layer.

An embodiment of the present invention is schematically illustrated in FIGS. 1–4. Referring to FIG. 1 there is schematically illustrated a substrate, with active regions 100 illustrated only in FIG. 1 but; omitted from FIGS. 2–4 for illustrative clarity. Contacts to active regions are identified. A dielectric sealing layer 10 is formed on the substrate and the first patterned metal layer (Metal 1) formed thereon. Dielectric sealing layer can be formed at a thickness of about 300 Å to about 1,000 Å. The illustrated device comprises six patterned metal layers (identified as Metal 1–Metal 6)with five levels of conductive vias (identified as Via 1–Via 5) electrically interconnecting features on spaced apart patterned metal layers. The ILDs comprise dielectric material 11, such as a silica aerogel, which appears throughout the interconnection structure.

Figure 2:
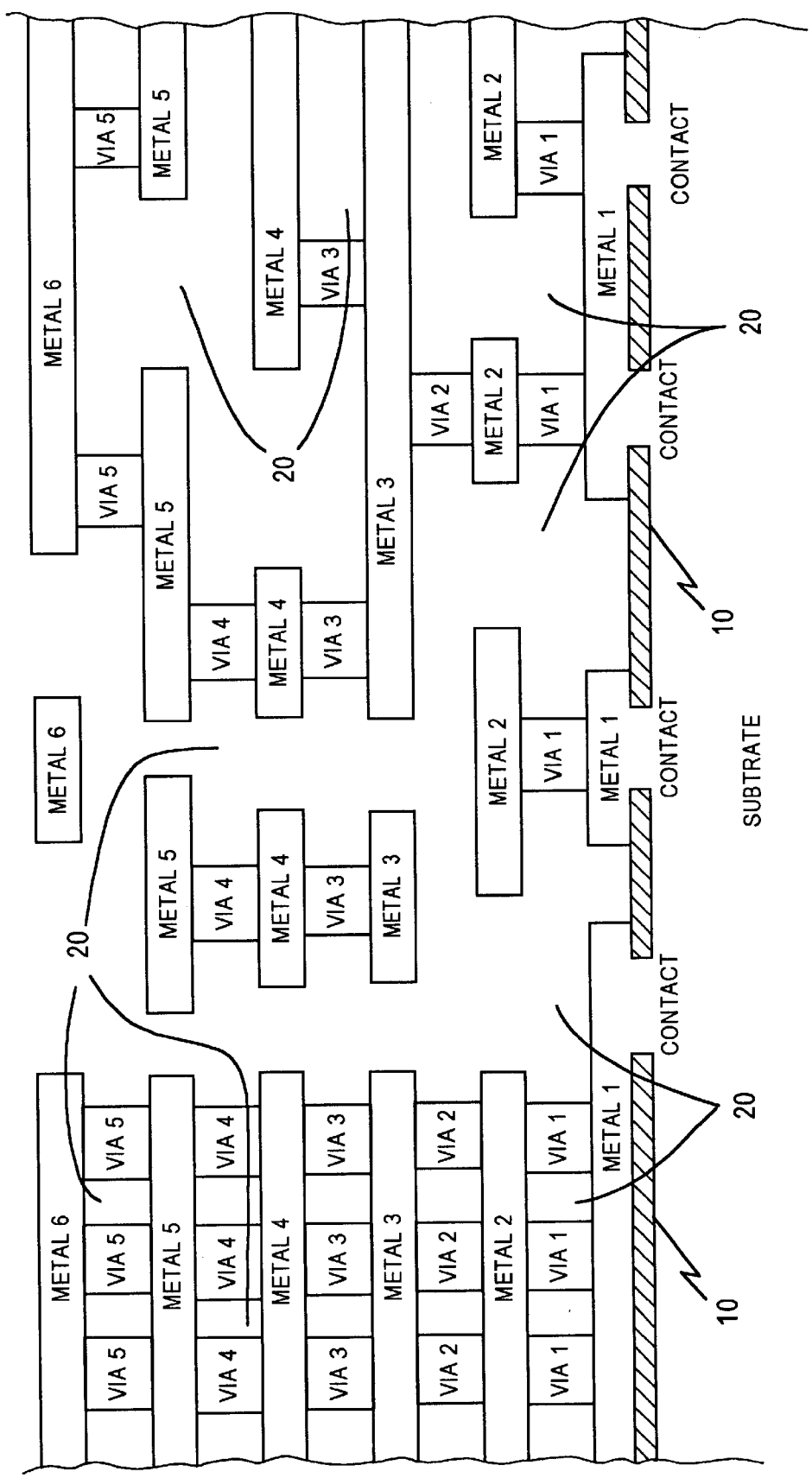

As shown in FIG. 2, the dielectric material 11 is removed, as with a slightly acidic buffered hydrofluoric acid solution, thereby creating voids or air gaps 20 throughout the interconnection structure. The formation of air gaps 20 significantly reduces the capacitance of the entire interconnection system as the dielectric constant of air is taken as one.

Figure 3:
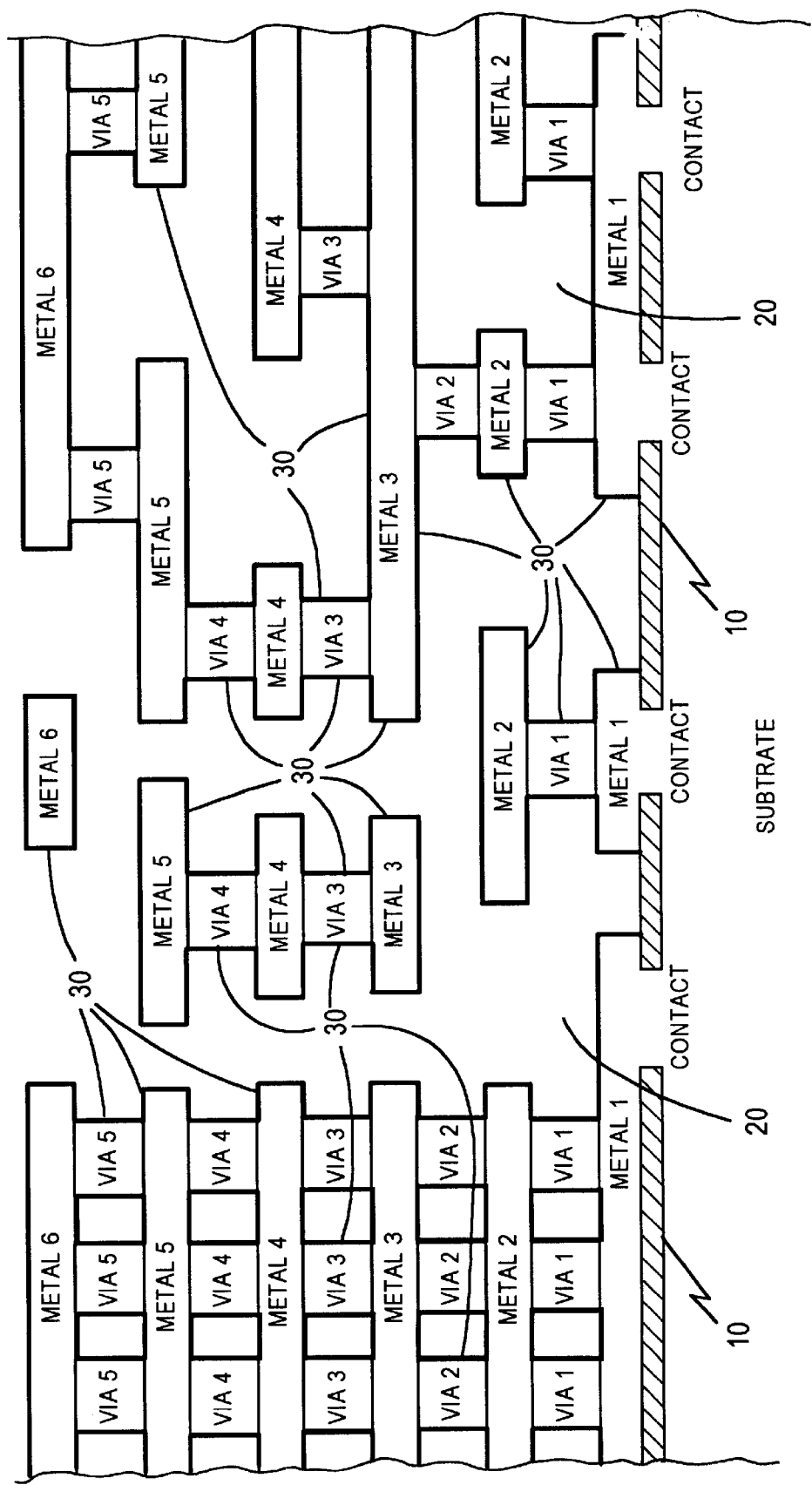
Figure 4:
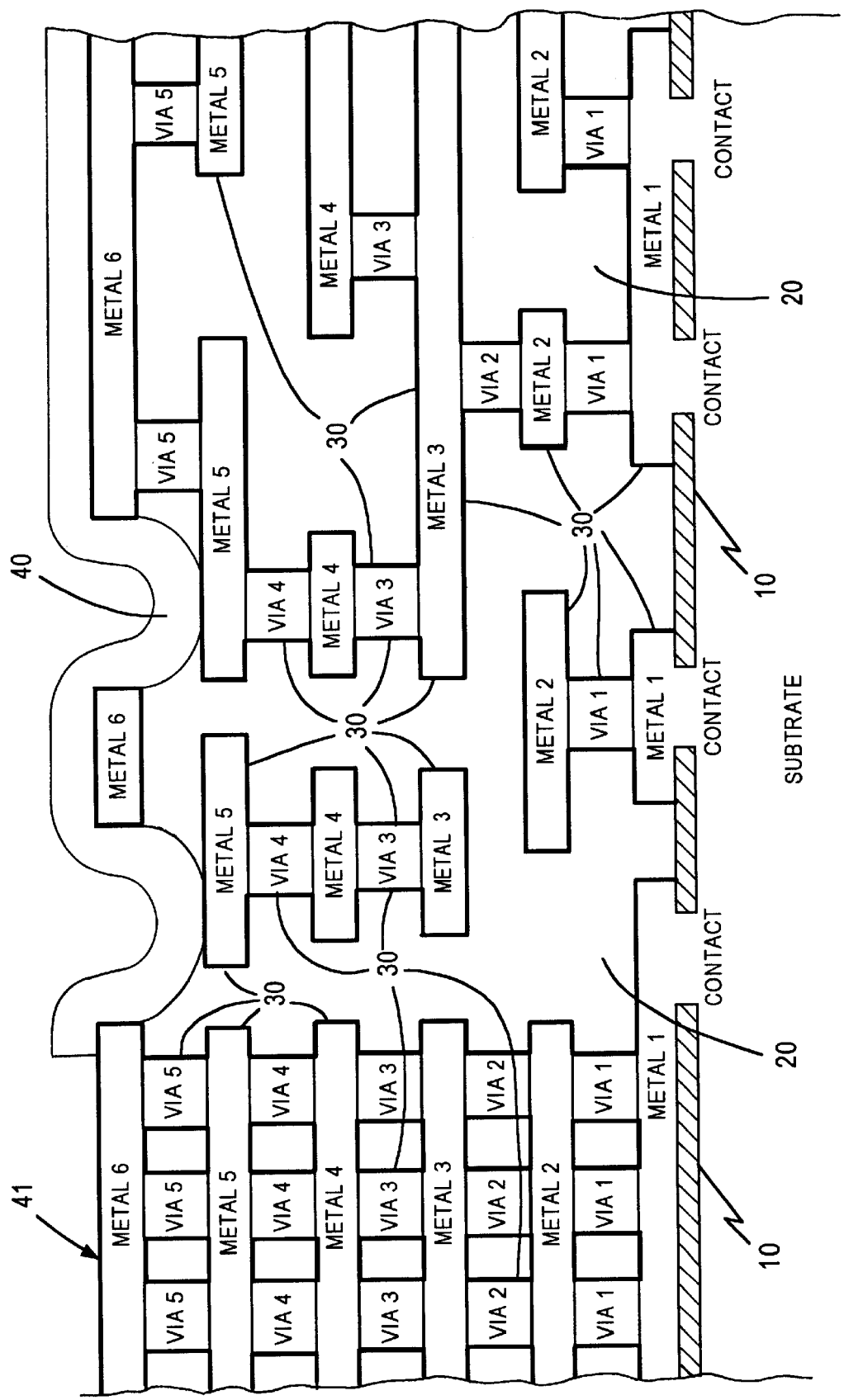

As shown in FIG. 3, a composite conductive liner 30 is applied to the interconnection system. The composite conductive liner 30 is formed by initially depositing a metal layer, such as Co or Ni, by a plurality of pulse electroplating stages with intermediate non-electroplating periods to substantially envelope the metal features and vias. A thin layer of polycrystalline silicon is then deposited by low pressure chemical vapor deposition on the metal layer and heating is conducted to react the deposited metal with the deposited polycrystalline silicon to form the conductive liner 30 comprising a composite of a metal layer and a metal silicide layer thereon. Composite conductive liner 30 provides structural rigidity to the entire interconnection system while preventing a decrease in electromigration resistance of the interconnection components. Subsequently, as shown in FIG. 4, dielectric protective or passivation layers 40 are deposited to protect the device from environmental contaminants. Reference numeral 41 denotes the bonding pad area which is not covered by dielectric protective layers 40.

The present invention provides efficient, cost effective methodology for manufacturing highly integrated semiconductor devices exhibiting increased circuit speed by significantly reducing the capacitance of the interconnection system without adversely impacting structural integrity or electromigration performance. The present invention includes the use of various metals for the interconnection system, such as aluminum, aluminum alloys, copper, copper alloys, as well as tungsten plugs in forming vias. Patterned metal layers can be formed in any conventional manner, as by blanket deposition and etch back techniques or damascene techniques, including single and dual damascene techniques.

The present invention is industrially applicable to the manufacture of any of various type of semiconductor devices. The present invention enjoys particular applicable in manufacturing highly integrated, multi-level semiconductor devices having submicron features, e.g. a design rule of less than about 0.18 micron.

Only the preferred embodiment of the present invention and but a few examples of its versatility are shown and described in the present disclosure. It is to be understood that the present invention is capable of using various other combinations and environments and is capable of changes or modifications within the scope of the inventive concept as expressed herein.

What is claimed is:

1. A method of manufacturing a semiconductor device, the method comprising:

forming a substrate with active regions;

forming an interconnection system comprising:
   a first patterned metal layer, over the substrate, having metal features electrically connected to the active regions by contacts;
   a plurality of patterned metal layers over the first patterned metal layer terminating with an upper most patterned metal layer, each patterned metal layer having metal features electrically connected to metal features of other patterned metal layers by vias;
   a plurality of interlayer-dielectrics comprising an inter-layer dielectric between each pair of consecutive patterned metal layers;

removing the inter-layer dielectrics; and forming a metal silicide conductive liner on the metal features and vias.

2. The method according to claim 1, further comprising:

forming a dielectric sling layer on the substrate; and forming the first patterned metal layer on the dielectric sealing layer.

3. The method according to claim 2, further comprising forming dielectric protective layers on the uppermost patterned metal layer.

4. The method according to claim 3, comprising:

forming each inter-layer dielectric by depositing a layer of a material selected from the group consisting of lead-rich glass soluble in acetic acid, benzocyclobutene resin and silica at a temperature less than about 400° C.; and removing the inter-layer dielectrics.

5. The method according to claim 3, wherein the dielectric sealing layer comprises a silicon nitride, or a composite of a hydrophobic material on silicon nitride, and the dielectric protective layers comprises an oxide.

6. The method according to claim 3, comprising forming the metal silicide conductive liner by:

selectively depositing a metal layer on the metal features and vias;

depositing a silicon layer on the metal layer; and heating to react the metal with the silicon to form the metal silicide layer.

7. The method according to claim 1, comprising forming the metal silicide conductive liner at a thickness of about 5,000 Å to about 15,000 Å.

8. The method according to claim 7, comprising forming the metal silicide conductive liner at a thickness of about 8,000 Å to about 10,000 Å.

9. The method according to claim 1, comprising removing the inter-layer dielectrics to form air gaps substantially continuous throughout the interconnection system.

10. The method according to claim 9, wherein the metal silicide liner substantially envelops the metal features and vias.

11. The method according to claim 9, comprising forming the metal silicide conductive liner directly on the metal features and vias.

12. The method according to claim 1, wherein the metal silicide conductive liner substantially envelops the metal features and vias.

13. A method of manufacturing a semiconductor device, the method comprising:

forming a substrate with active regions;

forming an interconnection system comprising:
   a first patterned metal layer, over the substrate, having metal features electrically connected to the active regions by contacts;
   a plurality of patterned metal layers over the first patterned metal layer terminating with an upper most patterned metal layer, each patterned metal layer having metal features electrically connected to metal features of other patterned metal layers by vias;
   a plurality of inter-layer dielectrics comprising an inter-layer dielectric between the patterned metal layers;

removing the inter-layer dielectrics;

selectively electroplating or electroless plating cobalt or nickel to form a metal layer on the metal features and vias;

depositing a silicon layer by low pressure chemical vapor deposition on the metal layer; and heating at a temperature of about 400° C. to about 500° C. to form a layer of cobalt silicide or nickel silicide, respectively.

14. The method according to claim 13, comprising depositing the cobalt or nickel by pulse electroplating.

15. The method according to claim 14, comprising pulse electroplating the cobalt or nickel in a plurality of stages with non-electroplating periods of sufficient duration to permit diffusion of the cobalt or nickel to the surfaces of the metal features and vias.

16. The method according to claim 15, comprising pulse electroplating the cobalt or nickel with non-electroplating periods of about 10 to about 60 seconds.

17. A method of manufacturing a semiconductor device, the method comprising:

forming a substrate with active regions;

forming an interconnection system comprising:
   a first patterned metal layer, over the substrate, having metal features electrically connected to the active regions by contacts;
   a plurality of patterned metal lavers over the first patterned metal layer terminating with an upper most patterned metal layer each patterned metal layer having metal features electrically connected to metal features of other patterned metal layers by vias; and
   a plurality of interlayer-dielectrics comprising an inter-layer dielectric between each pair of consecutive patterned metal layers;

removing the inter-layer dielectrics; and forming a metal silicide liner directly on the metal features and vias.

* * * * *